United States Patent
Morokuma et al.

(10) Patent No.: US 7,705,300 B2
(45) Date of Patent: Apr. 27, 2010

(54) CHARGED PARTICLE BEAM ADJUSTING METHOD AND CHARGED PARTICLE BEAM APPARATUS

(75) Inventors: Hidetoshi Morokuma, Hitachinaka (JP); Noriaki Arai, Hitachinaka (JP); Takashi Doi, Hitachinaka (JP); Fumihiro Sasajima, Hitachinaka (JP); Yoshihiro Kimura, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 76 days.

(21) Appl. No.: 11/104,631

(22) Filed: Apr. 13, 2005

(65) Prior Publication Data

US 2005/0236570 A1  Oct. 27, 2005

(30) Foreign Application Priority Data

Apr. 23, 2004 (JP) ............................ 2004-127519

(51) Int. Cl.
 *G01N 23/00* (2006.01)
(52) U.S. Cl. .................. 250/310; 250/311; 250/491.1
(58) Field of Classification Search .................. 250/310
See application file for complete search history.

(56) References Cited

U.S. PATENT DOCUMENTS

| | | | | |
|---|---|---|---|---|
| 4,871,912 A * | 10/1989 | Kokubo et al. | ............... | 250/311 |
| 4,983,832 A | 1/1991 | Sato | | |
| 5,466,904 A * | 11/1995 | Pfeiffer et al. | .......... | 219/121.25 |
| 5,627,373 A * | 5/1997 | Keese | .......................... | 250/310 |
| 6,380,546 B1 * | 4/2002 | Petrov et al. | ............ | 250/396 R |
| 6,864,493 B2 | 3/2005 | Sato et al. | | |
| 6,885,012 B2 | 4/2005 | Tanaka et al. | | |
| 6,956,211 B2 | 10/2005 | Sato et al. | | |
| 7,034,296 B2 | 4/2006 | Sato et al. | | |
| 2003/0006371 A1 | 1/2003 | Watanabe et al. | | |
| 2005/0006598 A1 * | 1/2005 | Pearl | ........................ | 250/492.1 |
| 2005/0012050 A1 * | 1/2005 | Shemesh | .................. | 250/491.1 |

FOREIGN PATENT DOCUMENTS

| | | |
|---|---|---|
| JP | 2001-110345 | 4/2001 |
| JP | 2002-134048 | 5/2002 |

(Continued)

OTHER PUBLICATIONS

Japanese Office Action, with Partial English Translation, issued in Japanese Patent Application No. JP 2004-127519 dated on Dec. 24, 2008.

(Continued)

*Primary Examiner*—David A. Vanore
*Assistant Examiner*—Phillip A. Johnston
(74) *Attorney, Agent, or Firm*—McDermott Will & Emery LLP

(57) ABSTRACT

In an apparatus for obtaining an image by irradiating a charged particle beam on a specimen, a condition of the beam conditioned differently from vertical incidence as in the case of the beam being tilted is required to be adjusted. To this end, the apparatus has a controller for automatically controlling a stigmator, an objective lens and a deflector such that astigmatism is corrected, focus is adjusted and view filed shift is corrected. The controller has a selector for inhibiting at least one of the astigmatism correction, focus adjustment and FOV shift correction from being executed.

11 Claims, 9 Drawing Sheets

FOREIGN PATENT DOCUMENTS

| | | |
|---|---|---|
| JP | 2003-022771 | 1/2003 |
| JP | A-2003-16983 | 1/2003 |
| JP | A-2004-127930 | 4/2004 |
| WO | WO 03/044821 | 5/2003 |

OTHER PUBLICATIONS

Japanese Office Action, with partial English translation, issued in Patent Application No. 2004-127519 dated on Jun. 24, 2008.

* cited by examiner

US 7,705,300 B2

CHARGED PARTICLE BEAM ADJUSTING METHOD AND CHARGED PARTICLE BEAM APPARATUS

BACKGROUND OF THE INVENTION

The present invention relates to a method of adjusting a beam condition for a charged particle beam and a charged particle beam apparatus and more particularly, to a method of making astigmatism correction, focus correction and FOV (field of view) shift correction when giving the beam a tilt.

In the charged particle beam apparatus represented by a scanning electron microscope, a charged particle beam is focused to a fine beam which in turn is scanned on a specimen to obtain desired information from the specimen (for example, a specimen image). In the charged particle beam apparatus as above, the resolving power becomes higher year by year and besides, recently, there is a growing need for obtaining a tilt image of a specimen by tilting a charged particle beam in relation to the specimen. This is accounted for by the fact that for acquisition of tilt images of the specimen, it is general to tilt a specimen stage but for the purpose of preventing a FOV shift at high magnification and acquiring a tilt image of the specimen more speedily, giving the charged particle beam a tilt in relation to the specimen is more rational than mechanically tilting the specimen stage.

A technique for irradiating a beam while tilting it is known as described in Patent Document 1 (JP-A-55-048610 (U.M.)) or Patent Document 2 (U.S. Pat. No. 4,983,832 corresponding to JP-A-02-033843), for instance. In the known technique, a charged particle beam is caused to be incident on a region which is out of axis of an objective lens and is then tilted using the focusing action (Imaging Action) of the objective lens.

SUMMARY OF THE INVENTION

The above prior art describes nothing about astigmatism correction, focus correction or FOV shift correction required to be dealt with when the beam is tilted. During the beam tilting, specific problems are caused which do not take place when the beam is incident on the specimen vertically thereof.

An object of this invention is to provide beam condition adjusting method and apparatus suitable for adjusting a beam condition when a beam is placed in condition different from vertically incident beam condition, as in the case of the beam tilting.

Firstly, according to the present invention, to accomplish the above object, a charged particle beam apparatus is provided which comprises a charged particle beam source, an objective lens for focusing a charged particle beam emitted from the charged particle beam source to irradiate it on a specimen, a detector for detecting charged particles emitted from the specimen, a deflector for deflecting the charged particle beam to a region which is out of axis of the objective lens to thereby tilt the charged particle beam in relation to an optical axis of the objective lens, a stigmator for correcting an astigmatic aberration of the charged particle beam, and a controller for automatically controlling the stigmator, objective lens and deflector such that when the charged particle beam is tilted, astigmatism correction and focus adjustment of the charged particle beam and FOV shift correction are conducted on the basis of the charged particles detected by the detector, wherein the controller includes selection means for inhibiting at least one of the astigmatism correction, focus adjustment and FOV shift correction from being carried out. According to the first construction, when the beam is tilted, an operator can set a correction condition at will in the light of his or her empirical rule by respecting achievement of high accuracy, achievement of low damage to specimen and achievement of speedup of processing speed which can be brought about by the beam condition correction.

Secondly, method and apparatus are provided in which when a charged particle beam is deflected from an optical axis of an objective lens for focusing the charged particle beam and is irradiated while being tilted in relation to the objective lens optical axis, pattern matching is conducted on the basis of comparison of a template based on an image acquired before the tilting with an image acquired after the tilting to correct a FOV shift for the charged particle beam on the basis of a result of the pattern matching. According to the second construction, even when the field of view is shifted owing to correction of the beam condition during the beam tilting, the shift can be corrected properly.

Thirdly, method and apparatus are provided in which when a charged particle beam is deflected from an optical axis of an objective lens for focusing the charged particle beam and is irradiated while being tilted in relation to the objective lens optical axis, a stigmator capable of adjusting intensities of astigmatism correction in a plurality of directions is used to determine evaluation values in respect of individual combinations of adjusting intensities in the plurality of directions and on the basis of a determined combination of adjusting intensities for which the evaluation value is high, a combination of adjusting intensities of the stigmator is settled. According to the third construction, an astigmatic aberration when the beam is tilted can be corrected properly.

Fourthly, method and apparatus are provided in which when a charged particle beam is deflected from an optical axis of an objective lens for focusing the charged particle beam and is irradiated while being tilted in relation to the objective lens optical axis, focus adjustment is conducted after the beam tilting and thereafter FOV shift correction is made. According to the fourth construction, when the beam is tilted, highly accurate FOV shift correction can be made on the basis of an image in exact focus.

As described above, according to this invention, beam condition adjusting method and apparatus can be provided which are suitable for adjusting the beam condition especially during the beam tilting. Other constructions and advantages of the present invention will become apparent when reading embodiments of the invention to be described hereinafter with reference to the accompanying drawings.

Other objects, features and advantages of the invention will become apparent from the following description of the embodiments of the invention taken in conjunction with the accompanying drawings.

DETAILED DESCRIPTION OF THE EMBODIMENTS

Figure 1:
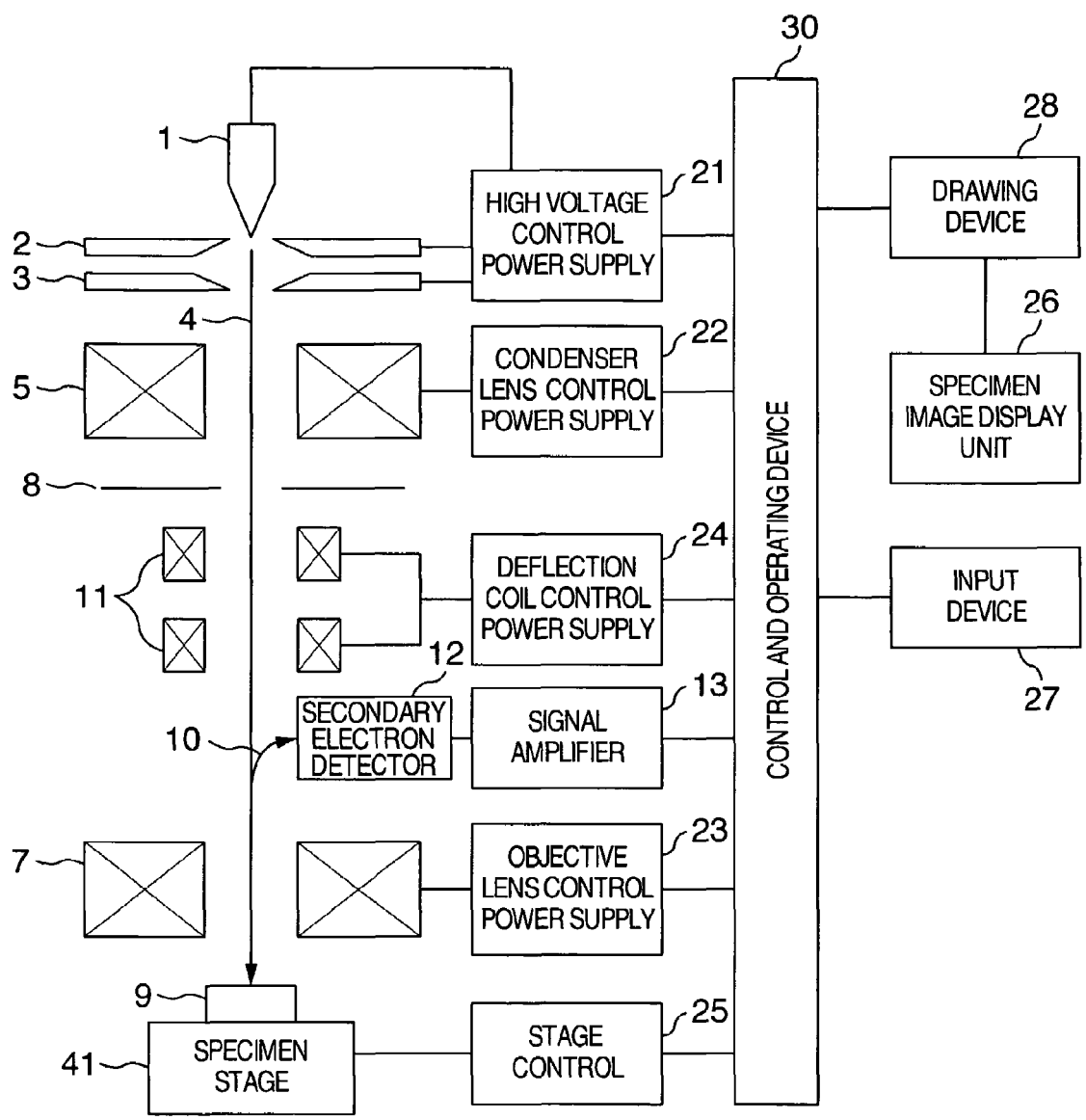
FIG. 1 is a schematic diagram showing the construction of a scanning electron microscope according to an embodiment of the invention.

Referring first to FIG. 1, the construction of a scanning electron microscope according to an embodiment of this invention will be described. A voltage is applied across cathode 1 and first anode 2 by means of a high voltage control power supply 21 controllable by a control and operating device 30 (control processor) and a predetermined amount of emission current is drawn out of the cathode 1. Since an accelerating voltage is applied across the cathode 1 and a second anode 3 by means of the high voltage control power supply 21 controlled by the control and operating device 30, an electron beam 4 emitted from the cathode 1 is accelerated to travel toward a succeeding lens system. The electron beam 4 is condensed with a condenser lens 5 controlled by a condenser lens control power supply 22 and its unnecessary region is eliminated by means of an aperture plate 8. Subsequently, the electron beam is focused into a small spot on a specimen 9 by means of an objective lens 7 controlled by an objective lens control power supply 23 and scanned two-dimensionally on the specimen by means of a deflector 11. Near the deflector 11, an image shift deflector (not shown) is arranged which is adapted for deflecting the electron beam 4 from its optical axis (the trajectory of the electron beam 4 when not being affected by deflection).

By using the image shift deflector, the scanning position of electron beam 4 can be changed in relation to the specimen 9. In addition, by deflecting the electron beam from an optical axis of the objective lens 7, the angle at which the electron beam 4 is irradiated on the specimen 7 can be changed. In the present invention, an example of changing the deflection angle of electron beam 4 through the use of the image shift deflector will be described but this is not limitative and for example, the electron beam may be deflected with anther type of deflector. The apparatus according to the present embodiment is also provided with a stigmator (not shown) to be described later.

A scanning signal of the deflector 11 is controlled in accordance with observation magnifications by means of a deflector control power supply 24. The specimen 9 is fixedly mounted on a specimen stage 41 which is movable two-dimensionally. The movement of the specimen stage 41 is controlled with a stage controller 25. Secondary electrons 10 generated from the specimen 9 under irradiation of the electron beam 4 are detected by a secondary electron detector 12 and a drawing unit 28 controls detected secondary signals such that they are converted into visual signals and are suitably arranged on a different plane, thereby ensuring that an image corresponding to a surface shape of the specimen can be displayed as a specimen image on a specimen image display unit 26.

An input device 27 is adapted to provide an interface between an operator and the control and operating device 30 and the operator controls the aforementioned units, designates a measure point and commands dimensional measurement through the medium of the input device 27. To add, the control and operating device 30 is provided with a memory unit not shown so that obtained measure values and control conditions for the individual units may be stored in the memory unit.

The signals detected by the secondary electron detector 12 are amplified by a signal amplifier 13 and thereafter accumulated in an image memory inside the drawing device 28. It will be appreciated that the apparatus of this embodiment is provided with the secondary electron detector 12 but this is not limitative and a backscattered electron detector for detection of backscattered electrons or a detector for detection of rays of light, electromagnetic waves or X-rays may be provided in substitution for the secondary electron detector or in combination thereof.

Address signals corresponding to memory positions of the image memory are generated in the control and operating device 30 or in a separately installed computer and then converted into analog signals which are in turn supplied to the deflector 11. In case the image memory has, for example, 512×512 pixels, an address signal in X direction is a digital signal repeating from 0 to 512 and an address signal in Y direction is a digital signal which repeats from 0 to 512 and is added with +1 at the time that the address signal in X direction starting from 0 reaches 512. These digital signals are converted into analog signals. Since an address of the image memory corresponds to an address of a deflection signal for scanning the electron beam, a two-dimensional image of a region within which the electron beam is deflected by the scanning coil is recorded in the image memory. To add, signals in the image memory can be read out sequentially on time series base by means of a read-out address generating circuit synchronized with a read clock. A signal read in correspondence with an address is converted into an analog signal to act as a brightness modulation signal for the specimen image display unit 28.

The image memory has the function to store images (image data) by overlapping (synthesizing) them for the purpose of improving the S/N ratio. For example, by storing images obtained through 8 two-dimensional scanning operations in the overlapping fashion, one complete image can be formed. In other words, images formed in a unit of one or more X-Y scanning operations are synthesized to form an ultimate image. The number of images for forming one complete image (frame cumulative number) can be set as desired and a proper value can be set by taking into account such a condition as secondary electron generation efficiency. By further overlapping plural images each formed by integrating a plurality of images, an image desired to be obtained ultimately can also be formed. At the time that a desired number of images are stored or after that, blanking of the primary electron beam may be executed to interrupt input of information to the image memory.

Where the frame cumulative number is set to 8, sequence may be set in which at the time that a ninth image is inputted, the first image is erased and as a result, 8 images remain or alternatively, weighted summing mean may be carried out in which when a ninth image is inputted, accumulated images stored in the image memory are multiplied by 7/8 and the product is added with the ninth image.

Also, the apparatus according to the present embodiment has the function to form a line profile on the basis of detected secondary electrons or backscattered electrons. The line profile is formed on the basis of amounts of detected electrons or brightness information of specimen images detected when a primary electron beam is scanned linearly or two-dimensionally and the thus obtained line profile is used for, for example, dimensional measurement of a pattern formed on a semiconductor wafer.

In the dimensional measurement of a pattern, two vertical or horizontal cursor lines are displayed, along with a specimen image, on the specimen image display unit 26, the two cursors are located at two edges of the pattern by manipulation through the input device 27 and on the basis of information of a magnification of an image of the specimen and a distance between the two cursors, the control and operating device 30 calculates a measurement value as a dimensional value of the pattern.

In the description given in connection with FIG. 1, the control processor (control and operating device) is described as being integral with the scanning electron microscope or equivalently thereto but this is in no way limitative and a process to be described below may be carried out with a control processor installed separately from the scanning microscope column. In that case, there need a transmission medium for transmission of detection signals detected by the secondary electron detector 12 to the control processor and for transmission of signals from the control processor to the lenses and deflector of scanning electron microscope and input/output terminals for input/output of the signals transmitted via the transmission medium. In an alternative, a program for execution of the process to be described below may be registered in a memory medium and the program may be executed by a control processor having an image memory and adapted to supply necessary signals to the scanning electron microscope.

Further, the apparatus according to the present embodiment has the function to precedently store, as a recipe, conditions (measure sites, optical conditions of the scanning electron microscope and the like) for observation of, for example, a plurality of points on a semiconductor wafer and conduct measurement and observation in accordance with the contents of the recipe. Furthermore, a program for performing the process to be described below may be registered in a memory medium and the program may be executed by a control processor having an image memory and adapted to supply necessary signals to the scanning electron microscope. More specifically, embodiments of the invention to be described hereinafter stand as inventions of a program adoptable in a charged particle beam apparatus such as a scanning electron microscope provided with an image processor.

Figure 2:
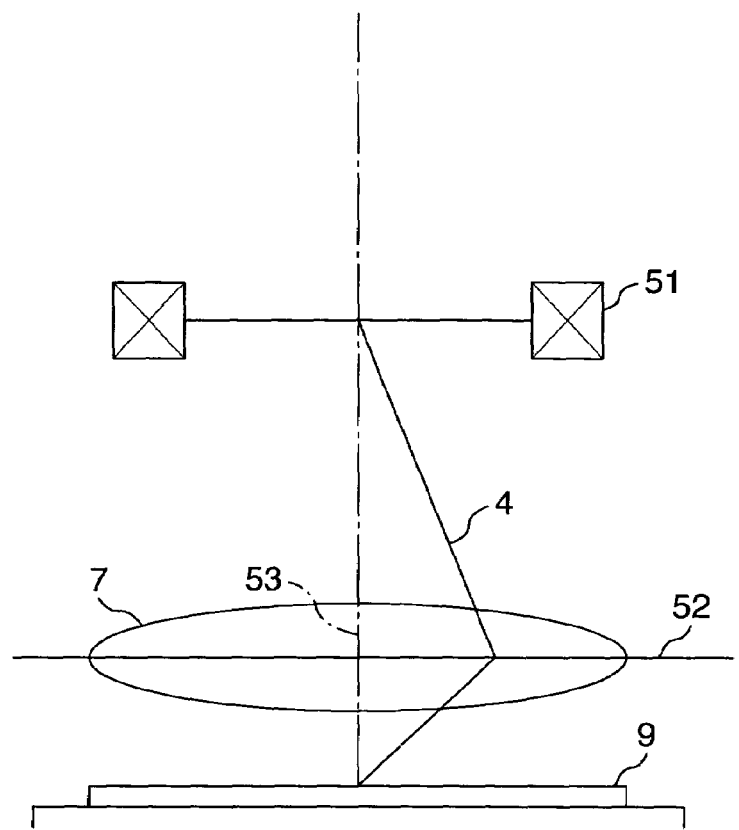
FIG. 2 is a diagram useful to explain an example in which an electron beam is irradiated on a specimen while being tilted through the use of an image shift deflector.

Turning now to FIG. 2, an example will be described in which an electron beam 4 is irradiated on a specimen 9 while being tilted through the use of a deflector arranged above the objective lens 7. The electron beam 4 can be tilted by means of the previously-described image shift deflector but any types of coil having ability to take a similar deflective action may be employed. The electron beam 4 is deflected from the electron beam optical axis by means of the deflector 51 and is caused to be incident on a lens principal plane 52 of objective lens 7 obliquely thereto. The electron beam 4 being incident on the lens principal plane 52 is affected by back deflective action of the objective lens 7 so as to be deflected toward the electron beam optical axis.

When the electron beam is irradiated by giving it a tilt, the locus of the beam deviates from the electron beam optical axis representing an original ideal locus, as designated by 53, giving rise to out-of-axis chromatic aberration and coma of the objective lens 7. In addition to the aberration of objective lens 7, errors in distance between deflector 51 and objective lens 7 due to mechanical assembling errors are involved, so that the tilted electron beam 4 will be irradiated at a site different from the optical axis 53 on the specimen 9 and the field of view of observation position is shifted. The out-of-axis chromatic aberration, coma and FOV shift (out of centering) caused in the course of tilting of the electron beam fatally impair the performance the apparatus for observing a desired position with high resolving power has originally. Embodiments of the invention to be described hereinafter solve the problems encountered when the electron beam is irradiated while being tilted.

Embodiment 1

Figure 3:
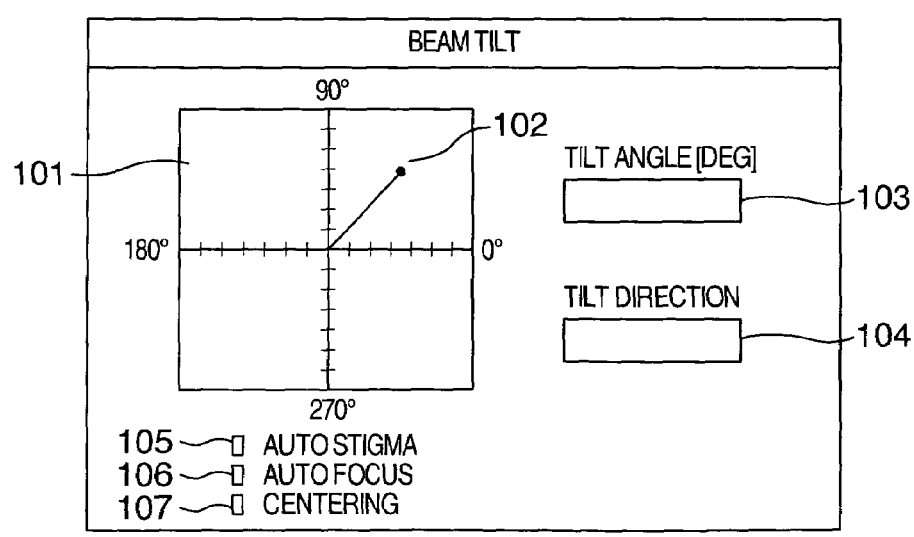
FIG. 3 is a diagram showing a GUI screen for setting conditions when the electron beam is irradiated while being tilted.

A GUI (graphical user interface) screen used to set conditions for irradiating an electron beam while giving it a tilt is illustrated in FIG. 3. The control and operating device 30 has a program for displaying such a picture on the specimen image display unit 26. On the basis of information set on the GUI screen, the aforementioned control and operating device 30 calculates current or voltage supplied to the deflector 51.

A viewing point adjustment picture 101 is for setting irradiation direction and irradiation angle of the electron beam. By adjusting a viewing point position 102 on the viewing point adjustment picture 101, an irradiation direction of the electron beam and an irradiation angle thereof can be set. A tilt angle and a tilt direction are displayed at a tilt angle value indicator 103 and a tilt direction indicator 104, respectively, on the basis of the viewing point setting on the viewing point adjustment picture 101. Alternatively, the tilt angle and tilt direction may be inputted directly, for instance. Provided beneath the viewing point adjustment picture 101 are check buttons for selecting a process to be performed during the electron beam tilting. A first check button 105 is for selecting whether an automatic astigmatism correction is to be made or not, a second check button 106 is for selecting whether an auto-focus correction is to be made or not and a third check button 107 is for selecting whether a centering function of FOV (field of view) is to be made or not.

The focus correction, astigmatism correction and FOV shift correction in the scanning electron microscope, for instance, are carried out on the basis of detection of electrons emitted or discharged from the specimen. For example, in the case of FOV shift correction, how much a featured object is moved between an image before a FOV shift and an image after it is decided by analyzing images formed on the basis of detection of secondary electrons. Making a decision on the basis of image processing needs to acquire images for decision, thus requiring a slight processing time and has some fear for damaging a specimen depending the kind of the specimen.

Structurally, the present embodiment can automatically perform all processes of automatic astigmatism correction, automatic focus correction and FOV shift correction during the electron beam tilting, wherein a means is provided which selects process by process whether the processes are to be carried out or not. Accordingly, the operator can select a processing item at will by taking damages to the specimen and a processing time into account. In other words, in an apparatus presupposing execution of the aforementioned three processes, the apparatus has the function to make such setting that at least one of these processes is not done selectively to enable the operator to make setting at will in the light of his or her empirical rule by respecting achievement of high accuracy, achievement of reduction of damage to the specimen and achievement of speedup of processing speed which can be brought about by the beam condition correction.

Also, the operator can set the necessity or non-necessity of beam adjustment while checking the beam for its tilt angle and tilt direction. Further, the operator can decides necessity or non-necessity of the above adjustments while visually grasping the degree of a tilt given to the beam. For example, when the beam is tilted, there is a possibility that the field of view is shifted as the focus changes. In case the tilt angle is small, the field of view sometimes hardly shifts even as the focus adjustment proceeds. The operator can afford to set at will necessity or non-necessity of FOV shift correction in accordance with the tilt angle and the necessity or non-necessity of focus adjustment.

Figure 4:
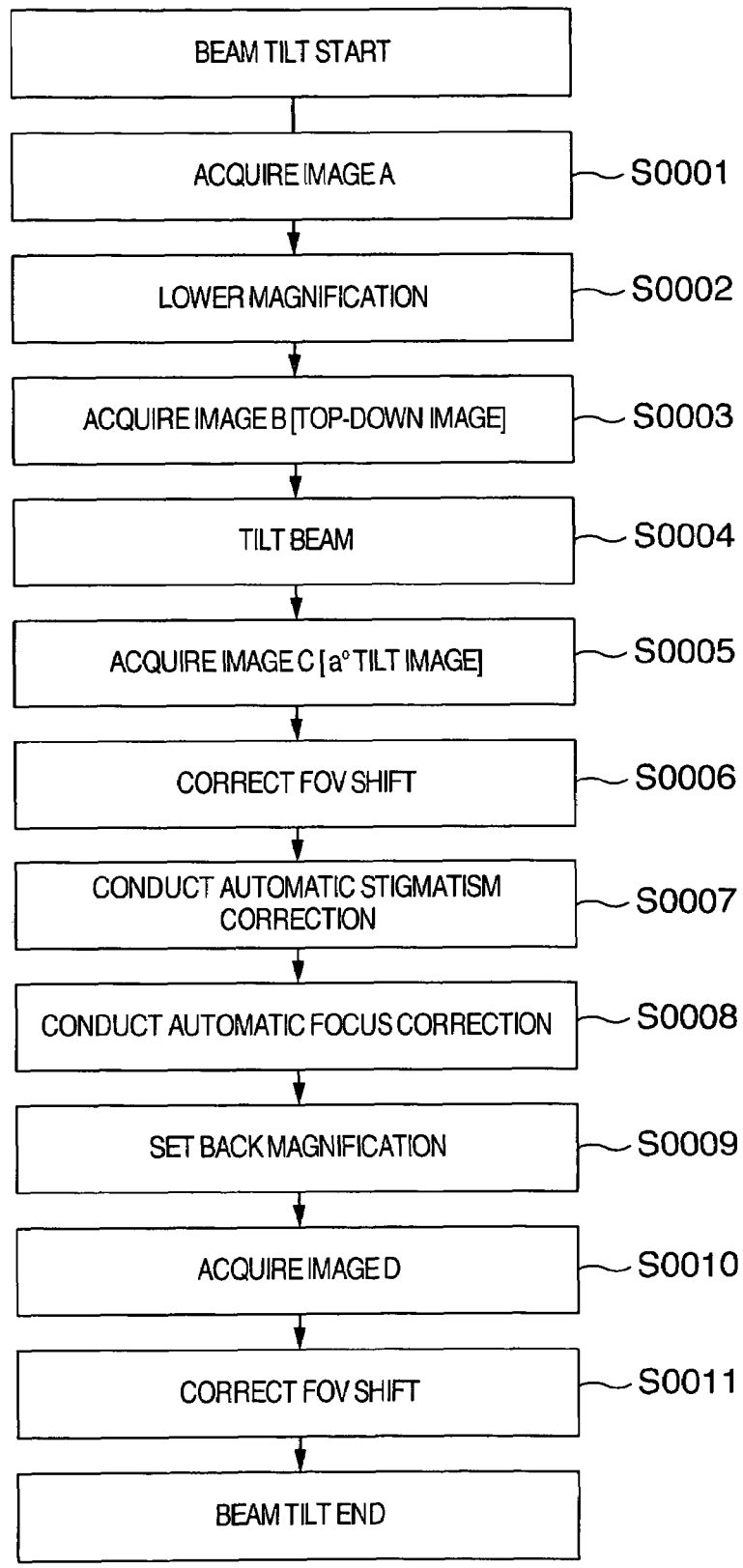
FIG. 4 is a flowchart useful to explain processing steps in making automatic astigmatism correction, automatic focus correction and FOV shift correction.

Referring now to FIG. 4, there is shown a flowchart for explaining process steps when making the automatic astigmatism correction, automatic focus correction and FOV shift correction during the electron beam tilting. When execution of beam tilt is selected on a program executed by the control and operating device 30 at the time that the field of view is positioned to an electron beam irradiation position on a specimen, a beam tilt process is started. The beam tilting is conducted by deflecting an electron beam from the electron beam optical axis through the use of the deflector 51 such as an image shift deflector as has been explained in connection with FIG. 2. In the control and operating device 30, current or voltage values supplied to the deflector are stored in respect of individual angles settable on the GUI screen as shown in FIG. 3.

Before tilting the beam, an image A is acquired (S0001). This image will be formed into a template for use in pattern matching to be described later. Next, the magnification is lowered (S0002) and an image B is acquired (S0003). The image obtained in the step S0003 is also formed into a template for the later pattern matching. Subsequently, while keeping the magnification lowered, the electron beam is tilted (S0004). In this phase, an image C after tilting is acquired (S0005) and pattern matching is carried out between the image C (beam tilt image) and the image B (none beam tilt image) acquired in the step S0003 to make an FOV (field of view) shift correction (S0006).

In the present embodiment, pattern matching is effected between the images obtained at different beam tilt angles to ensure that a shift of a view field after tilting from a view field before tilting can be corrected. With the FOV shifted through the beam tilting, there is a possibility that a measure object pattern is moved out of the field of view. In the present embodiment, the magnification is once lowered before beam tilting and a template of an image at a low magnification is formed. Then, this template for pattern matching is compared with an image obtained after beam tilting to correct a FOV shift. With this construction, even when the field of view is shifted to a large extent by the beam tilting, a pattern to be compared with the template will not go out of sight and the FOV shift correction can be permitted.

Next, the control and operating device 30 decides, on the GUI screen explained in connection with FIG. 3, whether the first check button 105 (automatic astigmatism correction) is selected. With the first check button 105 selected, a process in step S0007 is carried out. Similarly, automatic focus correction (S0008) is carried out when the second check button 106 is selected.

Next, a signal supplied to the deflector is changed in order that the same range as that for the image A can be scanned with the electron beam (at the same magnification as that for the image A) (S0009) and at that time, an image D is obtained (S0010). This image D is one acquired after the astigmatism correction and focus correction have been made and therefore, a FOV shift correction (S0011) based on pattern matching between the image D and the image A can be effected with high accuracy. The FOV shift correction (S0011) is conducted when the third check button 107 is selected.

As in the present embodiment, by letting the apparatus for making automatic astigmatism correction, automatic focus correction and automatic FOV shift correction have the function to make such setting that at least one or more of these processes are selectively prevented from being executed, compatibility between the throughput and the highly accurate measurement can be assured as described previously.

In the present embodiment, the processes of automatic astigmatism correction (S0007), automatic focus correction (S0008) and FOV shift correction (S0011) are sequentially executed in this order as described previously. Generally, after positioning an observation object and the like at the center of field of view, the astigmatism correction and focus correction are carried out. But when the objective lens condition is changed while keeping the beam tilted, there is a possibility that the specimen image will be shifted. Accordingly, in the present embodiment, the FOV shift correction is conducted after the astigmatism correction and focus correction have been made. Through this, even if the image is shifted as being affected by the astigmatism correction and focus correction, the image shift can be corrected. By defining the steps in this manner, the observation object can be prevented from going out of sight even when focusing is adjusted during the beam tilting and hence the astigmatism correction and focus correction during the beam tilting can be automated.

In the present embodiment, approximate positioning is completed using an image at a low magnification and thereafter a highly accurate specimen image is formed by adjusting the beam, followed by ultimate positioning using an image at a high magnification, and consequently automatic and highly accurate FOV shift correction can be materialized with ease.

Embodiment 2

Figure 5:
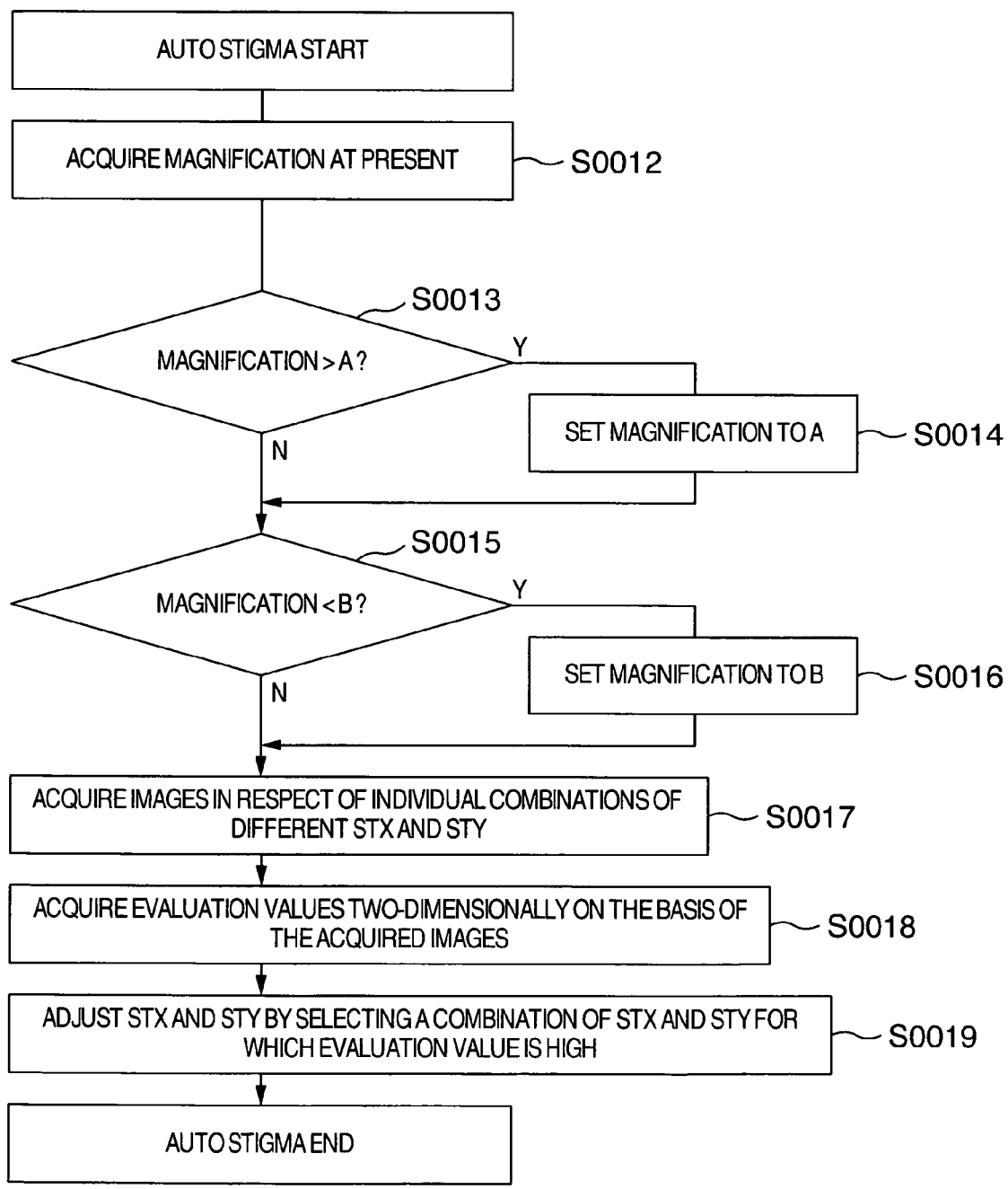
FIG. 5 is a flowchart useful to explain details of the automatic astigmatism correction (automatic stigmatization).
Figure 6:
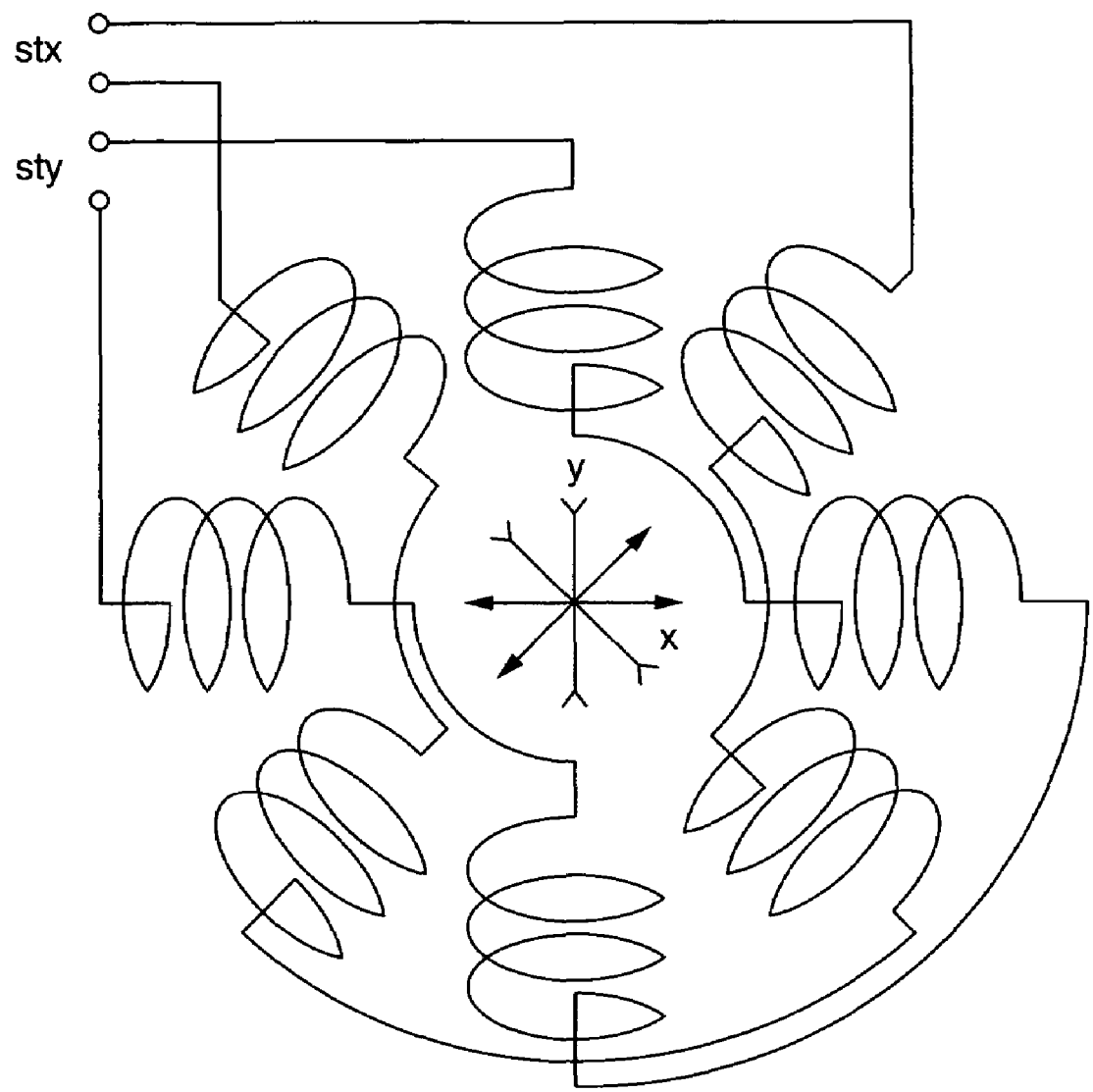
FIG. 6 is a diagram showing an example of a stigmator.

The automatic astigmatism correction (automatic stigmatization) explained in embodiment 1 will be detailed using a flowchart shown in FIG. 5. The stigmator is comprised of, for example, a multi-pole coil as shown in FIG. 6 and is interposed between cathode 1 and objective lens 7. The stigmator to be explained with reference to FIG. 6 is a two-dimensional sigmator in which astigmatic aberration correcting intensities in respective directions can be adjusted by adjusting signals stx and sty applied to the respective coils so as to correct an astigmatic aberration. In the present embodiment, astigmatism correction will be described by way of example of the two-dimensional astigmatism correction but this is not limitative and for example, a stigmator for making three-dimensional astigmatic aberration correction can also be applicable to the present embodiment.

Firstly, a magnification during astigmatism correction is acquired (S0012). If the magnification value is higher than a magnification upper limit A, this magnification value is automatically changed and set to magnification A (S0013, S0014) but if lower than a magnification lower limit B, this magnification value is automatically changed and set to magnification B (S0015, S0016). In making the astigmatism correction, there arises a problem that if the magnification is too low, the picture quality changes dully even when the lens intensity of objective lens is changed and as a result a sharp peak cannot be found in evaluation values plotted in relation to lens intensity values. Conversely, the magnification set to an excessively high value gives rise to a problem that when the astigmatism is changed by means of the stigmator, there is a possibility that a pattern on the specimen moves out of the screen and the pattern edge necessary for observation of changes in image quality cannot remain sufficiently in the field of view. In such an event, the image quality can hardly be evaluated correctly in the course of changing of the astigmatism.

Hence, according to the present embodiment, in the event that the magnification deviates from values within a predetermined range before making an astigmatism correction, the magnification is corrected to permit a proper astigmatism correction to be made. There is a possibility that such a problem as above will also arise during focus adjustment and therefore, the magnification may be restricted as above during focus adjustment.

Figure 7A:
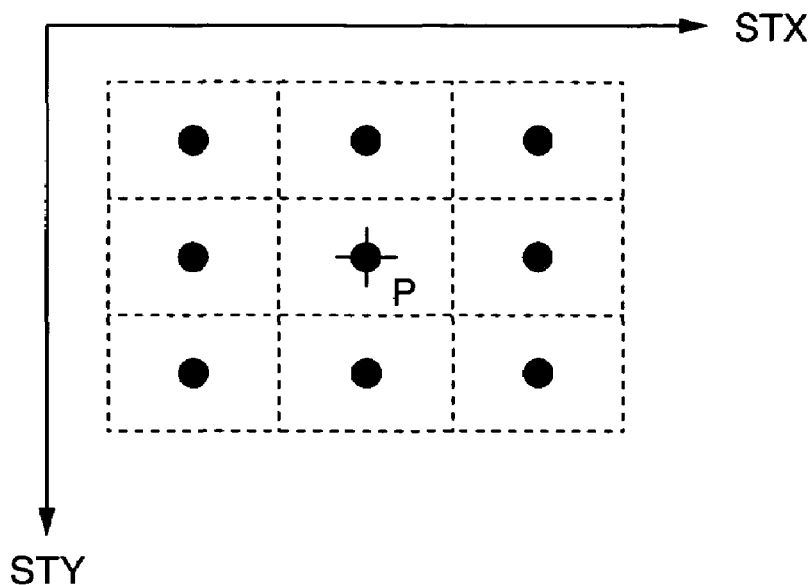
FIGS. 7A and 7B are diagrams showing an example of acquiring evaluation values of the stigmator two-dimensionally.

Subsequently, the signals stx and sty are changed in combination to obtain evaluation values two-dimensionally as shown in FIG. 7A. In an example shown in FIG. 7A, evaluation values for 3×3=9 sites can be acquired. The evaluation value can be determined by image-processing the sharpness (abruptness of a change in contrast) at an edge portion appearing in the field of view. More specifically, signals stx and sty are deflected from a position P corresponding to the signals stx and sty at present to obtain images corresponding to individual different combinations of stx and sty (S0017). Evaluation values are acquired in respect of these images to obtain two-dimensional evaluation results (S0018).

In case a combination of stx and sty exhibiting a high evaluation value (peak evaluation value) corresponding to the position P is found from the obtained two-dimensional evaluation results, the combination of stx and sty is set as a proper astigmatism correction amount (S0019). Further, by approximating evaluation values acquired two-dimensionally at the 9 sites with a two-dimensional Gaussian curve, a more accurate astigmatism correction amount may be obtained.

Figure 7B:
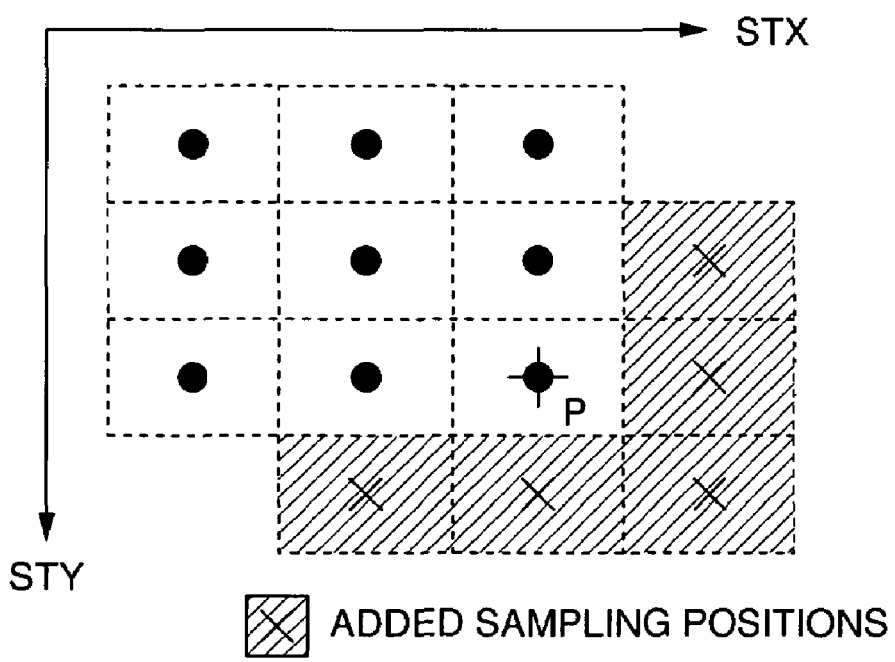

To the contrary, when a peak evaluation value exists at an edge of an area where evaluation values are obtained two-dimensionally as shown in FIG. 7B, points getting outwardly clear of that point must be sampled. If the result shows that the point, designated at P, exhibits the highest evaluation value, a combination of stx and sty corresponding to the point P is set as a proper astigmatism correction amount. In addition, by approximating evaluation values acquired two-dimensionally at 9 sites around the center point P with a two-dimensional Gaussian curve as described previously, a more accurate astigmatism correction amount may be obtained.

If a position at which the evaluation value is higher than that at the point P exists when the position is kept clear of the point P outwardly, the clear off position or point can impersonate a new P point and points around it can be sampled to determine an optimum astigmatism correction amount in a similar way.

As described above, the proper astigmatism correction amount can be settled. According to the present embodiment, the astigmatic aberration during the beam tilting can be corrected with high accuracy. With the beam tilted, the electron beam travels along a locus out of axis of the objective lens to generate an astigmatic aberration the amount of which is larger than that of an astigmatic aberration caused when the beam is vertically incident. For this reason, if only one of the signals stx and sty (for example, only stx) is changed, the evaluation value is anyhow reduced when a large deviation takes place in the direction (for example, sty) in which the signal is not changed and there is a possibility that any peak of evaluation values cannot be presumed highly accurately. According to this embodiment, even when a relatively large astigmatic aberration takes place, an optimum correction amount can be determined with high accuracy by changing both the stx and sty simultaneously and then finding evaluation values.

Further, by measuring in advance an astigmatic aberration taking place when giving the beam a tilt and approximately estimating a deform direction and a deform amount of the beam to precedently set astigmatism correction amounts to some extent, time required for determining an optimum astigmatism correction amount (sampling time for determining the optimum astigmatism correction amount) can be reduced drastically.

Embodiment 3

Figure 8:
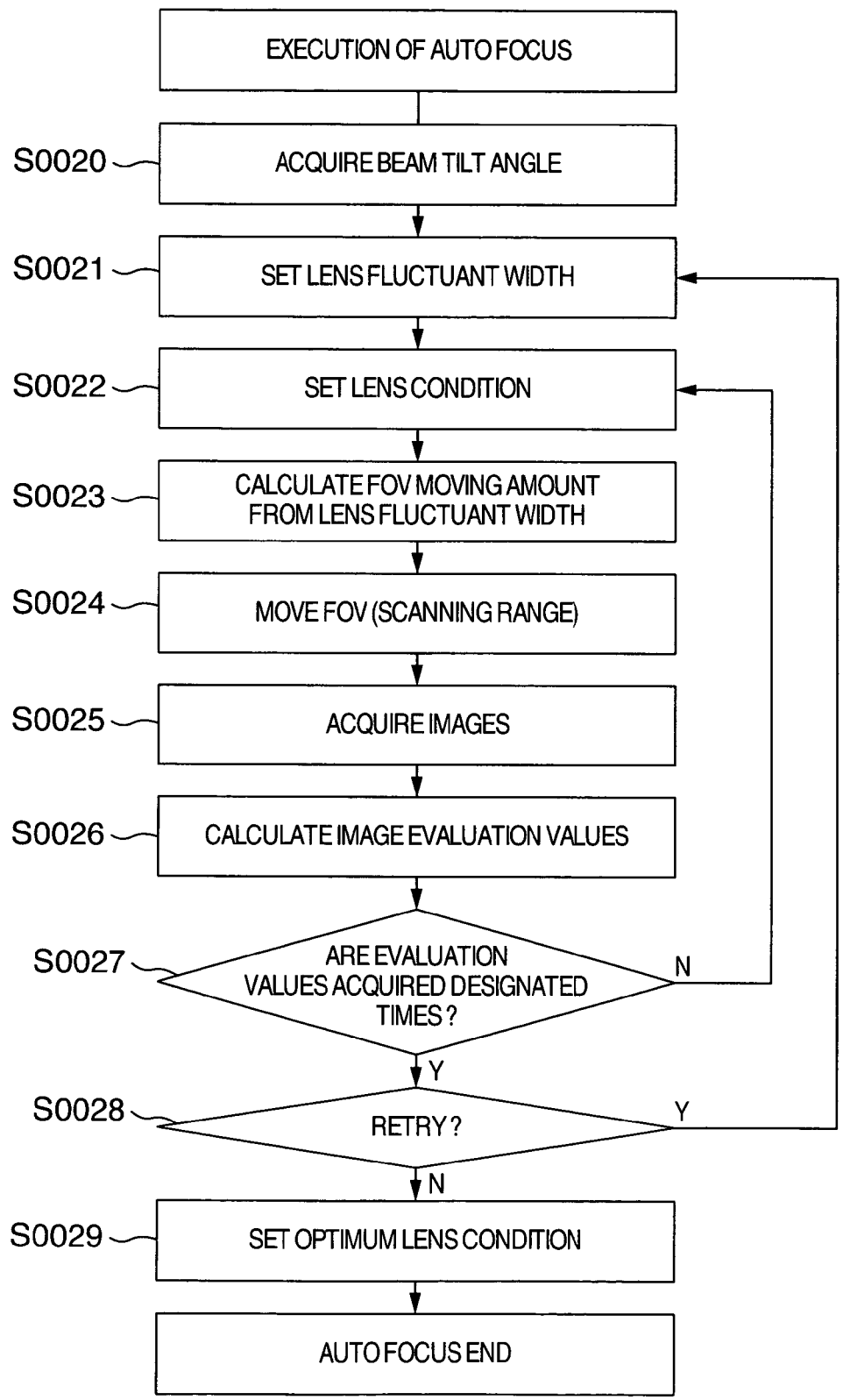
FIG. 8 is a flowchart useful to explain details of automatic focus correction (auto-focus).

The automatic focus correction explained in connection with embodiment 1 will be detailed with reference to a flow-chart of FIG. 8. When the lens intensity of objective lens is changed while placing the beam in tilt condition, the field of view moves. This is because the beam tilt causes an x-y direction component (when the objective lens optical axis direction is defined as z direction) to be included in the direction in which focus is to be adjusted. Described in the present embodiment is a focus adjustment method and the construction therefor which can conduct proper focus adjustment even when the view field movement occurs.

Firstly, at a beam not placed in tilt condition (top-down image) the center of FOV is set to a suitable pattern, in the FOV, then focus is adjusted using the pattern. Next, a desired beam tilt angle is set in a desired beam tilt direction (S0020). The beam tilt direction and beam tilt angle correspond to those set on the GUI screen of FIG. 3. In this phase, the lens intensity of objective lens is adjusted to make matching with an exact focus. An amount of change of lens intensity (inclusive sign) and an amount of FOV shift (inclusive of direction) at that time are measured. This work is done at individual angles in individual beam tilt directions. This work may also be done in respect of all combinations of beam tilt directions and beam tilt angles or alternatively may be done by approximating, in terms of expression, part of combinations to presume remaining combinational conditions.

The FOV shift and focus offset in case of beam tilt described in above are added as correction values in advance when giving the beam a tilt. The FOV shift amount can be adjusted by adjusting the image shift deflector or movement of the stage. This can prevent the focus and view field from shifting to a great extent during beam tilting and time of succeeding focus adjustment work can be shortened. Next, the lens intensity is fluctuated to determine a more suitable focal position. In this phase, the FOV shift correction amount is corrected by means of the image shift deflector in accordance with the previously-determined relational expression between lens intensity change and FOV shift amount. In this manner, the FOV shift can be reduced even in the focus adjustment during the beam tilting without degrading the accuracy of focus adjustment. The focus adjustment is carried out by fluctuating the objective lens condition in plural steps so as to acquire images, selecting an image of high focus evaluation value from the acquired images and selecting an objective lens condition used for forming an image for which the evaluation value is high.

Within a fluctuation width of objective lens condition set in step S0021, steps S0022 to S0026 are repeated predetermined times (S0027) and an objective lens condition for the highest focus evaluation value is detected from the conditions obtained through the steps S0022 to S0027. If any peak cannot be found within the fluctuation width of lens condition (in the case of the evaluation value increasing monotonously or decreasing monotonously), there is a possibility that the range within which the objective lens condition is fluctuated is unsuitable and therefore, the fluctuation range is reset (S0028) and then an exact focal position of objective lens condition is again detected. The objective lens condition settled in this manner is set as an optimum lens condition (S0029).

With the above construction, even when the objective lens condition is changed in performing automatic focus adjustment on the basis of image evaluation, images can be evaluated in the same specimen area to permit highly accurate focus adjustment.

In the case of a magnetic objective lens using a ferromagnetic material (for example, iron core coil), a given magnetic field is sometimes generated in a short time after current is passed through the lens so that a desired focus condition may be obtained. This phenomenon is called a magnetic aftereffect and because of the magnetic aftereffect, movement of the view field sometimes keeps continuing for a while after the focus adjustment and images are drifted during image accumulation to blur an ultimate image.

In the present embodiment, even when the focus adjustment needs to be effected plural times in the same view field as in the case of a three-dimensional structure, images are not acquired before the focus condition is stabilized following the focus adjustment for the purpose of suppressing image blur of a cumulated image, thereby permitting acquisition of a cumulative image removed of image blur.

To add, a technique is available which forms an electrostatic lens by applying a negative potential to the specimen and/or applying a positive potential to the electron beam passage of the objective lens. Thus, when the focus adjustment needs to be done for the same field of view plural times in the course of beam tilting, for example, the focus adjustment may be done by selectively using the electrostatic lens to solve the above problem.

Embodiment 4

Figure 9:
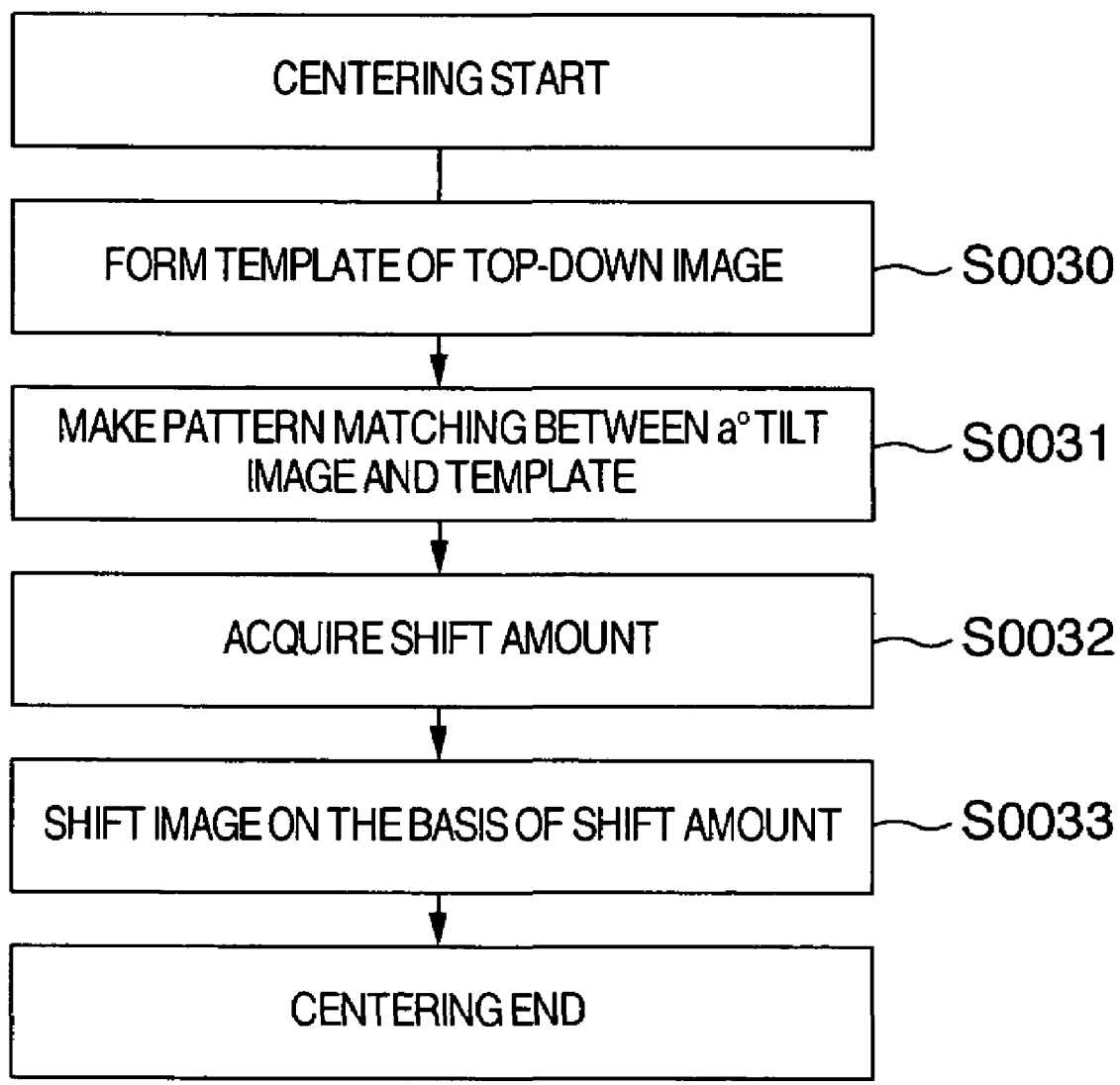
FIG. 9 is a flowchart useful to explain details of FOV shift correction (centering).

The FOV shift correction (centering) carried out in the steps S0006 and S0011 in the flowchart shown in FIG. 4 will be described in greater detail with reference to a flowchart of FIG. 9. In step S0030, a template is formed on the basis of an image acquired in the step S0001 or S0003 in FIG. 4. The beam used in this phase is one irradiated in the same direction as the electron beam optical axis or in the direction vertical to the specimen surface direction.

Next, pattern matching is carried out between an image after beam tilt acquired in the step S0005 or S0010 and the template formed in the step S0030 (S0031). On the basis of this pattern matching, a shift amount between the image before tilting and the image after tilting is acquired (S0032) and view field correction based on the image shift is conducted on the basis of the shift amount (S0033). This FOV shift correction corresponds to the step S0006 or S0011 in FIG. 4.

By performing the pattern matching through the use of images before and after the beam tilting as in the present embodiment, a FOV shift attributable to the beam tilting can be corrected. Further, according to the flowchart shown in FIG. 4, images are acquired at a high magnification and a low magnification before the beam is tilted to form templates and the FOV shift correction is made on the basis of these templates. According to these steps, even when the field of view is shifted to a great extent depending on the beam condition adjustment during the beam tilting, the beam condition can be adjusted while correcting the FOV shift properly.

In addition, when images for FOV shift correction are acquired (S0010) after the beam condition adjustment (S0007, S0008) has been completed, a FOV shift based on images acquired under good condition can be detected, thereby ensuring that the FOV shift correction can be done with high accuracy.

Embodiment 5

In the example shown in FIG. 4, the beam tilting direction is described as being one in number but there is available a technique for structuring a three-dimensional image by irradiating an electron beam in at least two directions to form two images and superimposing these images. In this case, the steps S0004 to S0011 of FIG. 4 are executed in respect of the respective tilt angles, coincident points between obtained two images are found and the two images are synthesized such that the coincident points overlap with each other. In structuring a three-dimensional image, techniques disclosed in embodiments 1 to 4 can cooperatively be used to structure a highly accurate three-dimensional image.

In case a plurality of sites at which three-dimensional images are to be structured exist on the specimen, images may be acquired with a beam incident on the sites at one irradiation angle and thereafter images may be acquired with a beam incident on the sites at a different irradiation angle. For example, images for templates of all of the plural sites are first acquired with a vertically incident beam and thereafter images of all of the plural sites are acquired by giving the beam a tilt, thus obtaining images for beam condition adjustment and three-dimensional image structuring.

Through the process as above, time required for beam tilting can be reduced and when a plurality of measuring points exist, the overall measuring time can be shortened.

Embodiment 6

Figure 10:
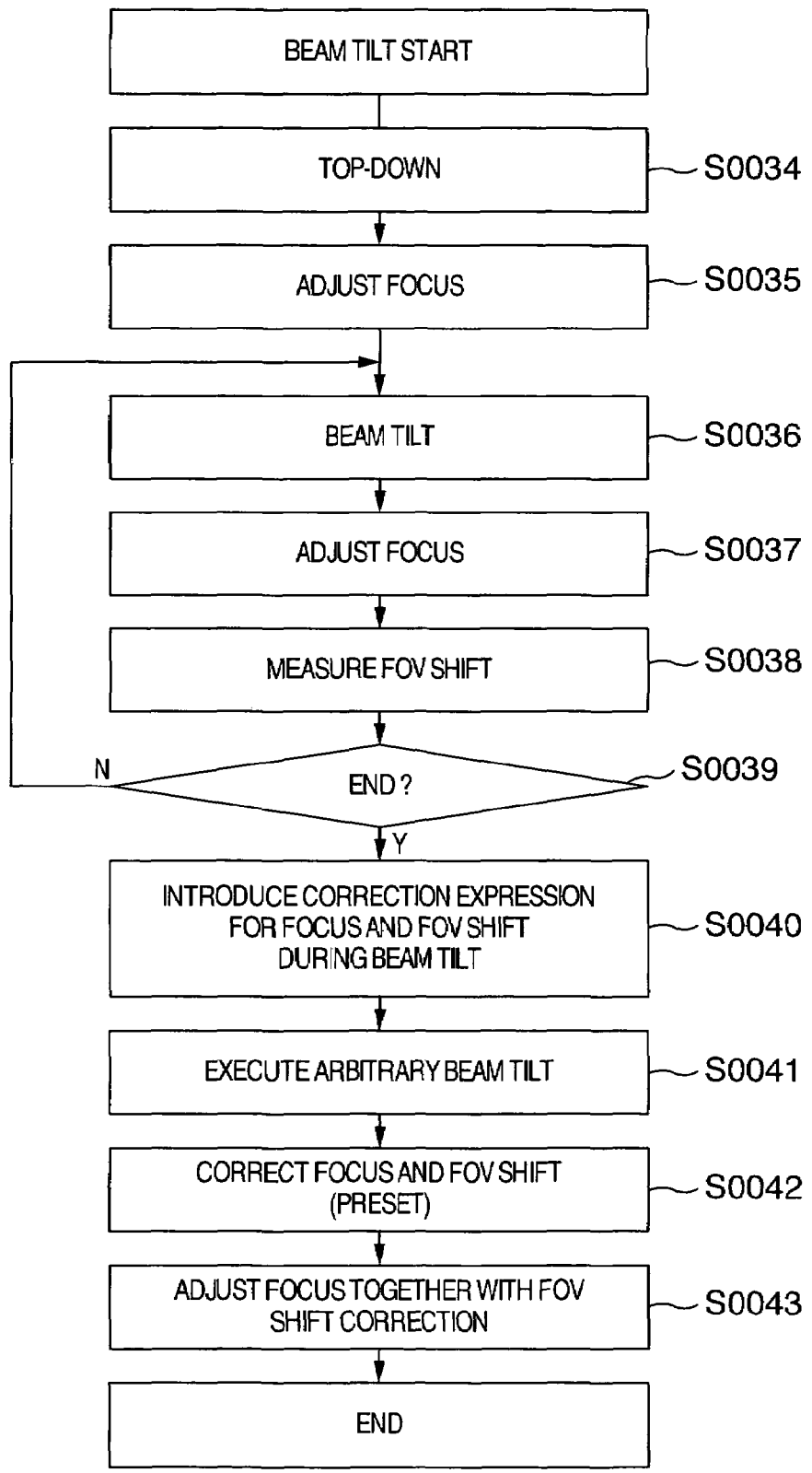
FIG. 10 is a flowchart useful to explain an example of preparing expressions for correcting the amount of focus adjustment and the amount of FOV shift correction in relation to tilt angles.

An example of preparing an expression of correcting the focus adjustment amount and the FOV shift correction amount in relation to the tilt angle by measuring FOV shift amounts during electron beam tilting will be described using a flowchart of FIG. 10. In step S0034, a top-down image before beam tilting is first acquired. This top-down image is identical to the image A explained in connection with embodiment 1. Next, focus evaluation is effected using the top-down image and focus adjustment for the top-down image is carried out (S0035). Next, with the top-down image kept in focus, the beam is tilted (S0036). With the beam tilted, the focus is adjusted (S0037) and a FOV shift at that time is measured (S0038). This process is carried out for each beam tilt angle. FOV shift amounts (inclusive of shift directions) and focus adjustment amounts are stored in respect of the individual tilt angles, thus ending the process (S0039). Subsequently, on the basis of differences of focus adjustment amounts and differences of FOV shift amounts for the individual tilt angles, correction expressions are introduced, individually (S0040).

As described above, the expressions of correcting the focus adjustment amounts and FOV shift amounts in relation to beam tilt angles are prepared, so that even when the beam is tilted at a desired angle (S0041), a focus adjustment amount and a FOV shift amount which conform to the angle can be calculated to effect the focus adjustment and FOV shift correction (S0042, S0043).

The description of the foregoing embodiments of this invention has been given by way of example of the scanning electron microscope but this is not limitative and the present invention can also be applicable to another type of charged particle beam apparatus such as an ion beam apparatus.

Aspects of the present invention can be set forth as below:

1. A charged particle beam apparatus having a charged particle beam source, an objective lens for focusing a charged particle beam emitted from the charged particle beam source so as to irradiate it on a specimen, a detector for detecting charged particles emitted from the specimen, and a deflector for deflecting the charged particle beam to a region which is out of axis of the objective lens and tilting the charged particle beam in relation to an optical axis of the objective lens, the apparatus comprising a controller for preparing a template from an image formed under irradiation of the charged particle beam along the objective lens optical axis, comparing the template with an image acquired when the charged particle beam is tilted in relation to the objective lens optical axis and detecting a shift between a field of view before tilting of the charged particle beam and a field of view after tilting of the charged particle beam.

2. A charged particle beam adjusting method for correcting, when a charged particle beam is irradiated while being tilted in relation to an optical axis of an objective lens, an astigmatic aberration of the charged particle beam by using a stigmator capable of adjusting astigmatism correction intensities in a plurality of directions, comprising the steps of:

acquiring images in respect of individual combinations of adjustment intensities in the plural directions;

determining evaluation values of the respective images; and settling a combination of adjustment intensities of the stigmator on the basis of a combination of adjustment intensities for which the evaluation value is high.

3. A charged particle beam adjusting method according to above 2, wherein the image acquisition is effected within a predetermined range of magnification.

4. A charged particle beam apparatus having a charged particle beam source, an objective lens for focusing a charged particle beam emitted from the charged particle beam source so as to irradiate it on a specimen, a detector for detecting charged particles emitted from the specimen, a deflector for deflecting the charged particle beam to a region which is out of axis of the objective lens and tilting the charged particle beam in relation to an optical axis of the objective lens, and a stigmator capable of adjusting astigmatism correction intensities in a plurality of directions, the apparatus comprising a controller for acquiring images in respect of individual combinations of astigmatism correction intensities in the plural directions, determining evaluation values of the respective images and settling a combination of adjustment intensities of the stigmator on the basis of a combination of adjustment intensities for which the evaluation value is high.

5. A charged particle beam adjusting method for adjusting conditions for a charged particle beam when irradiating the charged particle beam while giving it a tilt in relation to an optical axis of an objective lens, wherein when the charged particle beam is irradiated while being tilted to the objective lens optical axis, focus adjustment is carried out after the beam tilting and thereafter FOV shift correction is made.

6. A charged particle beam apparatus having a charged particle beam source, an objective lens for focusing a charged particle beam emitted from the charged particle beam source so as to irradiate it on a specimen, a detector for detecting charged particles emitted from the specimen, and a deflector for deflecting the charged particle beam to a region which is out of axis of the objective lens and tilting the charged particle beam in relation to the objective lens optical axis, the apparatus comprising a controller for controlling, when the charged particle beam is irradiated while being tilted in relation to the objective lens optical axis, the objective lens and the deflector such that focus adjustment by means of the objective lens is carried out after the beam tilting and thereafter FOV shift correction is made.

7. A charged particle beam adjusting method for evaluating, from an image obtained when a charged particle beam is irradiated on a specimen, focus of the charged particle beam and/or FOV shift, comprising the steps of:

measuring focus adjustment amounts and/or FOV shift amounts from individual plural images acquired when the charged particle beam is irradiated on the specimen in a plurality of tilting directions; and preparing expressions of correcting the focus adjustment amounts and/or FOV shift amounts on the basis of the measured focus adjustment amounts and/or the measured FOV shift amounts.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus comprising:

a charged particle beam source;

an objective lens for focusing a charged particle beam emitted from said charged particle beam source so as to irradiate a specimen with the charged particle beam;

a deflector for deflecting the charged particle beam from an optical axis of said objective lens to cause said objective lens to deliver the charged particle beam to the specimen from a direction different from the optical axis of said objective lens towards the optical axis of said objective lens;

a detector for detecting charged particles emitted from the specimen;

a stigmator for correcting an astigmatic aberration of the charged particle beam; and a controller for automatically controlling said stigmator, objective lens and deflector such that when the charged particle beam is tilted, astigmatism correction and focus adjustment of the charged particle beam and FOV (Field of View) shift correction are conducted on the basis of the charged particles detected by said detector; and wherein said controller is configured for selectively inhibiting at least one of the astigmatism correction, focus adjustment and FOV shift correction from being carried out, when the charged particle beam is irradiated to the specimen on a tilt; and wherein said controller is further configured to:

acquire a first image before tilting the charged particle beam with a first magnification for acquiring a required tilt image;

acquire a second image before tilting the charged particle beam with a second magnification lower than the first magnification after the first image is acquired;

tilt the charged particle beam by said deflector to irradiate the specimen with the tilted charged particle beam from a direction different from the optical axis after the second image is acquired;

acquire a third image with the second magnification after the charged particle beam is tilted;

perform a first FOV shift correction by comparing the third image with the second image, adjust an optical condition of the charged particle beam after the first FOV shift correction is performed,
acquire a fourth image after tilting the charged particle beam with the first magnification after the adjustment of the optical condition; and
perform a second FOV shift correction by comparing the fourth image with the first image.

2. A charged particle beam apparatus according to claim 1, wherein said controller includes means for setting a tilt angle of the charged particle beam.

3. A charged particle beam apparatus according to claim 1, wherein said controller controls said objective lens and said deflector in sequence of the astigmatism correction and FOV shift correction.

4. A charged particle beam apparatus according to claim 1, wherein said controller controls said stigmator and said deflector in sequence of the astigmatism correction and FOV shift correction.

5. A charged particle beam apparatus according to claim 1, wherein said controller controls said stigmator, objective lens and deflector in sequence of the astigmatism correction, focus correction and FOV shift correction.

6. A charged particle beam adjusting method for adjusting a condition of a charged particle beam when the charged particle beam is irradiated while being tilted in relation to an optical axis of an objective lens, comprising the steps of:
forming a first image of a pattern on a specimen with a first magnification for acquiring a required tilt image before tilting the charged particle beam;
preparing a first template on the basis of the first image;
acquiring a second image with a second magnification lower than the first magnification after the first image is acquired and before the charged particle beam is tilted,
preparing a second template on the basis of the second image;
tilting the charged particle beam to irradiate the specimen with the tilted charged particle beam from a direction different from the optical axis after the second image is acquired,
acquiring a third image with the second magnification after the charged particle beam is tilted,
performing a first FOV shift correction by pattern matching between the third image and the second template,
adjust an optical condition of the charged particle beam after the first FOV shift correction is performed,
acquiring a fourth image with the first magnification after the charged particle beam is tilted and the optical condition is adjusted, and
performing a second FOV shift correction by pattern matching between the prepared first template and the fourth image.

7. A charged particle beam adjusting method according to claim 6, wherein the charged particle beam is deflected such that the FOV shift is corrected on the basis of the detected FOV shift.

8. A charged particle beam adjusting method according to claim 6, wherein after the beam has been tilted, focus of the charged particle beam is adjusted and an image acquired under irradiation of the charged particle beam subjected to the focus adjustment is compared with the first template.

9. A charged particle beam apparatus comprising:
a charged particle beam source;
an objective lens for focusing a charged particle beam emitted from said charged particle beam source so as to irradiate a specimen with the charged particle beam;
a deflector for deflecting the charged particle beam from an optical axis of said objective lens to cause said objective lens to deliver the charged particle beam to the specimen from a location out of the optical axis to an intersection of a surface of the specimen with the optical axis;
a detector for detecting charged particles emitted from the specimen; and
a controller for controlling an FOV (Field of View) position on the specimen; and
wherein said controller is further configured to:
acquire a first image before tilting the charged particle beam with a first magnification for acquiring a required tilt image;
acquire a second image before tilting the charged particle beam with a second magnification lower than the first magnification after the first image is acquired;
tilt the charged particle beam by said deflector to irradiate the specimen with the charged particle beam from a direction different from the optical axis, after the second image is acquired;
acquire a third image with the second magnification after the charged particle beam is tilted;
perform a first FOV shift correction by comparing the acquired third image with the second image;
adjust an optical condition of the charged particle beam after the first FOV shift correction is performed;
acquire a fourth image after tilting the charged particle beam with the first magnification and the optical condition is adjusted; and
perform a second FOV shift correction by comparing the acquired fourth image with the first image.

10. A charged particle beam apparatus according to claim 9, wherein said controller further performs at least one of astigmatism correction and focus adjustment of the charged particle beam after the FOV shift correction is performed by comparing the acquired third image with the second image.

11. A charged particle beam apparatus according to claim 10, wherein:
the adjustment of the optical condition of the charged particle beam after the first FOV shift correction is performed includes the astigmatism correction and the focus adjustment; and
said controller performs the astigmatism correction and the focus adjustment, in order.

* * * * *